United States Patent
Kumagai

(10) Patent No.: US 8,159,297 B2
(45) Date of Patent: Apr. 17, 2012

(54) TRANSMISSION DEVICE, DISTORTION COMPENSATION DEVICE, AND DISTORTION COMPENSATION METHOD

(75) Inventor: Kazuhiko Kumagai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 74 days.

(21) Appl. No.: 12/801,694

(22) Filed: Jun. 21, 2010

(65) Prior Publication Data

US 2010/0327971 A1 Dec. 30, 2010

(30) Foreign Application Priority Data

Jun. 26, 2009 (JP) ................. 2009-152592

(51) Int. Cl.
*H03F 1/26* (2006.01)
*H03G 3/20* (2006.01)
(52) U.S. Cl. ........................... 330/149; 330/136
(58) Field of Classification Search .................. 330/136, 330/149, 297, 127
See application file for complete search history.

(56) References Cited

U.S. PATENT DOCUMENTS

| 6,703,897 B2 * | 3/2004 | O'Flaherty et al. ........... 330/149 |
| 2007/0009062 A1 | 1/2007 | Matsuura et al. |
| 2007/0159242 A1 | 7/2007 | Nagatani et al. |
| 2007/0159256 A1 | 7/2007 | Ishikawa et al. |

FOREIGN PATENT DOCUMENTS

| JP | 2005-101908 | 4/2005 |
| JP | 2007-180795 | 7/2007 |
| JP | 2007-189438 | 7/2007 |
| WO | 2006/054464 A1 | 5/2006 |

* cited by examiner

*Primary Examiner* — Robert Pascal
*Assistant Examiner* — Khiem Nguyen
(74) *Attorney, Agent, or Firm* — Fujitsu Patent Center

(57) ABSTRACT

A transmission device includes an amplifier that amplifies a transmission signal according to a voltage to be applied, an envelope detector that detects an envelope signal of the transmission signal, a rate decreasing unit that decreases changing rate of the envelope signal detected by the envelope detector, and a voltage controller that changes the voltage applied to the amplifier according to the envelope signal whose changing rate is decreased by the rate decreasing unit.

7 Claims, 14 Drawing Sheets

TRANSMISSION DEVICE, DISTORTION COMPENSATION DEVICE, AND DISTORTION COMPENSATION METHOD

CROSS-REFERENCE TO RELATED APPLICATION(S)

This application is based upon and claims the benefit of priority of the prior Japanese Patent Application No. 2009-152592, filed on Jun. 26, 2009, the entire contents of which are incorporated herein by reference.

FIELD

The embodiments discussed herein are directed to a transmission device, a distortion compensation device, and a distortion compensation method.

BACKGROUND

Conventionally, a transmission device such as a radio base station device in a mobile communication system amplifies a signal as a transmission target (hereinafter, "transmission signal") by an amplifier. The amplifier is often caused to operate generally near a nonlinear characteristic portion in terms of improvement of amplification efficiency, and, in this case, there is a problem that distortion caused by nonlinear characteristic (hereinafter, "nonlinear distortion") occurs in many cases. Meanwhile, if the amplifier is caused to operate in a linear characteristic portion, there is another problem that the amplification efficiency decreases although less nonlinear distortion occurs.

Therefore, in order to deal with the problems, there are proposed various technologies for operating the amplifier with high efficiency in the nonlinear characteristic portion and suppressing occurrence of the nonlinear distortion. For example, there is known a technology for receiving a transmission signal as an input signal and changing a voltage to be applied to the amplifier appropriately by following an envelope signal of the input signal (see Japanese Laid-open Patent Publication No. 2007-180795).

Here, a conventional transmission device that adopts the conventional technology will be explained below. FIG. 15 is a diagram of a configuration of the conventional transmission device. As represented in FIG. 15, a conventional transmission device 1 includes an amplifier 2, an envelope detector 3, and a voltage controller 4.

The amplifier 2 amplifies a transmission signal according to a voltage to be applied and outputs the amplified transmission signal to a transmission antenna 5. The envelope detector 3 detects an envelope signal of the transmission signal and inputs the detected envelope signal to the voltage controller 4.

The voltage controller 4 changes the voltage applied to the amplifier 2 according to the input envelope signal. For example, the voltage controller 4 generates a pulse signal with a pulse width according to the input envelope signal, and performs switching of the voltage applied to the amplifier 2 according to the pulse signal by using a predetermined switching device.

As explained above, the conventional transmission device 1 appropriately changes the voltage applied to the amplifier 2 according to the input signal, to thereby cause the amplifier 2 to operate in the nonlinear characteristic portion with high power efficiency.

However, the conventional transmission device has a problem that distortion different from nonlinear distortion may occur in the amplifier 2 if a communication system for handling a broadband transmission signal such as OFDM (Orthogonal Frequency Division Multiplexing) is used.

For example, in the OFDM communication system, because the envelope signal of the transmission signal changes at a high rate, switching by the voltage controller 4 of the transmission device may be delayed. Therefore, there occurs a phase difference between the voltage applied to the amplifier 2 by the voltage controller 4 and the transmission signal input to the amplifier 2. Consequently, distortion of the transmission signal occurs in the amplifier 2. It should be noted that in the present specification, the distortion occurring in the amplifier 2 caused by the phase difference between the voltage applied to the amplifier 2 by the voltage controller 4 and the transmission signal input to the amplifier 2 is called "voltage-control distortion".

FIG. 16 is a diagram of schematic input/output gain characteristics of the amplifier 2. In FIG. 16, a horizontal-axis indicates a power level of an input signal and a vertical-axis indicates an input/output gain. If there occurs a phase difference between the voltage applied to the amplifier 2 by the voltage controller 4 and the transmission signal input to the amplifier 2, as represented in FIG. 16, an input/output gain fluctuates according to magnitude of the voltage V applied to the amplifier 2 even if the input signal to the amplifier 2 is at the same power level Pa. As explained above, the conventional transmission device has some problem that when there occurs the phase difference between the voltage applied to the amplifier 2 by the voltage controller 4 and the transmission signal input to the amplifier 2, the voltage-control distortion occurs in the amplifier 2.

SUMMARY

According to an aspect of an embodiment of the invention, a transmission device includes an amplifier that amplifies a transmission signal according to a voltage to be applied; an envelope detector that detects an envelope signal of the transmission signal; a rate decreasing unit that decreases a changing rate of the envelope signal; and a voltage controller that changes the voltage applied to the amplifier according to the envelope signal of which changing rate is decreased by the rate decreasing unit.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments will be explained with reference to accompanying drawings. It should be noted that the transmission device disclosed in the present application is applied to, for example, a radio base station device and other various communication devices in a mobile communication system.

[a] First Embodiment

First, an overview of a transmission device according to a first embodiment will be explained below. The transmission device according to the first embodiment, when a transmission signal is to be amplified by an amplifier, detects an envelope signal of the transmission signal, decreases a changing rate of the detected envelope signal, and then changes a voltage applied to the amplifier according to the envelope signal with decreased changing rate. This allows suppression of voltage-control distortion occurring in the amplifier.

Figure 1:
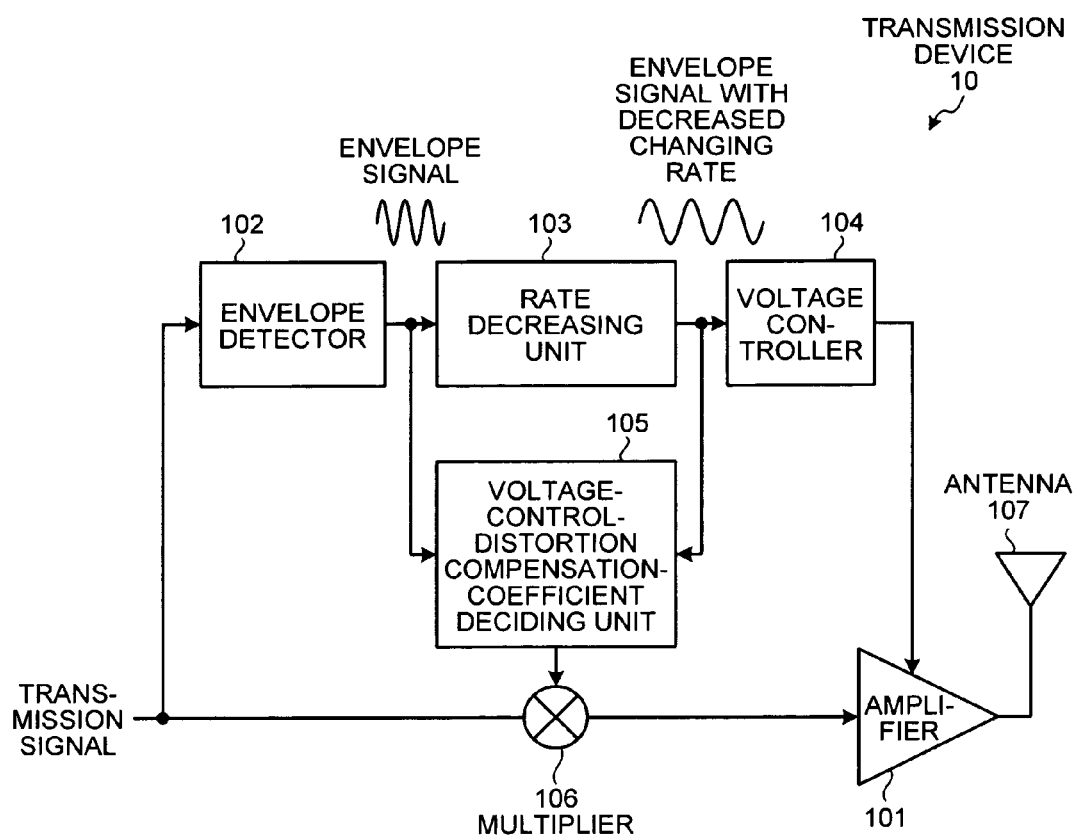
FIG. 1 is a diagram of a configuration of a transmission device according to a first embodiment.

Next, a configuration of a transmission device 10 according to the first embodiment will be explained below. FIG. 1 is a diagram of the configuration of the transmission device 10 according to the first embodiment. As represented in FIG. 1, the transmission device 10 includes an amplifier 101, an envelope detector 102, a rate decreasing unit 103, a voltage controller 104, a voltage-control-distortion compensation-coefficient deciding unit 105, and a multiplier 106. It should be noted that the multiplier 106 may be a complex multiplier.

The amplifier 101 amplifies a transmission signal according to an applied voltage and outputs the amplified transmission signal to a transmission antenna 107.

The envelope detector 102 detects an envelope signal of the transmission signal, and outputs the detected envelope signal to the rate decreasing unit 103.

The rate decreasing unit 103 decreases a changing rate of the envelope signal detected by the envelope detector 102.

The voltage controller 104 changes a voltage applied to the amplifier 101 according to the envelope signal whose changing rate is decreased by the rate decreasing unit 103. For example, the voltage controller 104 generates a pulse signal with a pulse width according to the envelope signal with decreased changing rate, and performs switching of the voltage applied to the amplifier 101 according to the pulse signal by using a known switching element.

This allows the voltage controller 104 to change the voltage applied to the amplifier 101 without occurrence of a switching delay even if an input envelope signal is an envelope signal of the transmission signal in the OFDM communication system in which the envelope signal changes at a comparatively high rate. Therefore, the phase difference between the voltage applied to the amplifier 101 by the voltage controller 104 and the transmission signal input to the amplifier 101 can be reduced. As a result of this, the voltage-control distortion occurring in the amplifier 101 can be suppressed.

The voltage-control-distortion compensation-coefficient deciding unit 105 decides a voltage-control-distortion compensation coefficient, which is a coefficient for compensating for voltage-control distortion, according to the envelope signal detected by the envelope detector 102 and the envelope signal whose changing rate is decreased by the rate decreasing unit 103. The voltage-control-distortion compensation-coefficient deciding unit 105 outputs the decided distortion compensation coefficient to the multiplier 106.

The multiplier 106 multiplies the transmission signal by the voltage-control-distortion compensation coefficient decided by the voltage-control-distortion compensation-coefficient deciding unit 105, and outputs the transmission signal to the amplifier 101. This allows the amplifier 101 to output a signal in which the voltage-control distortion is further suppressed.

Figure 2:
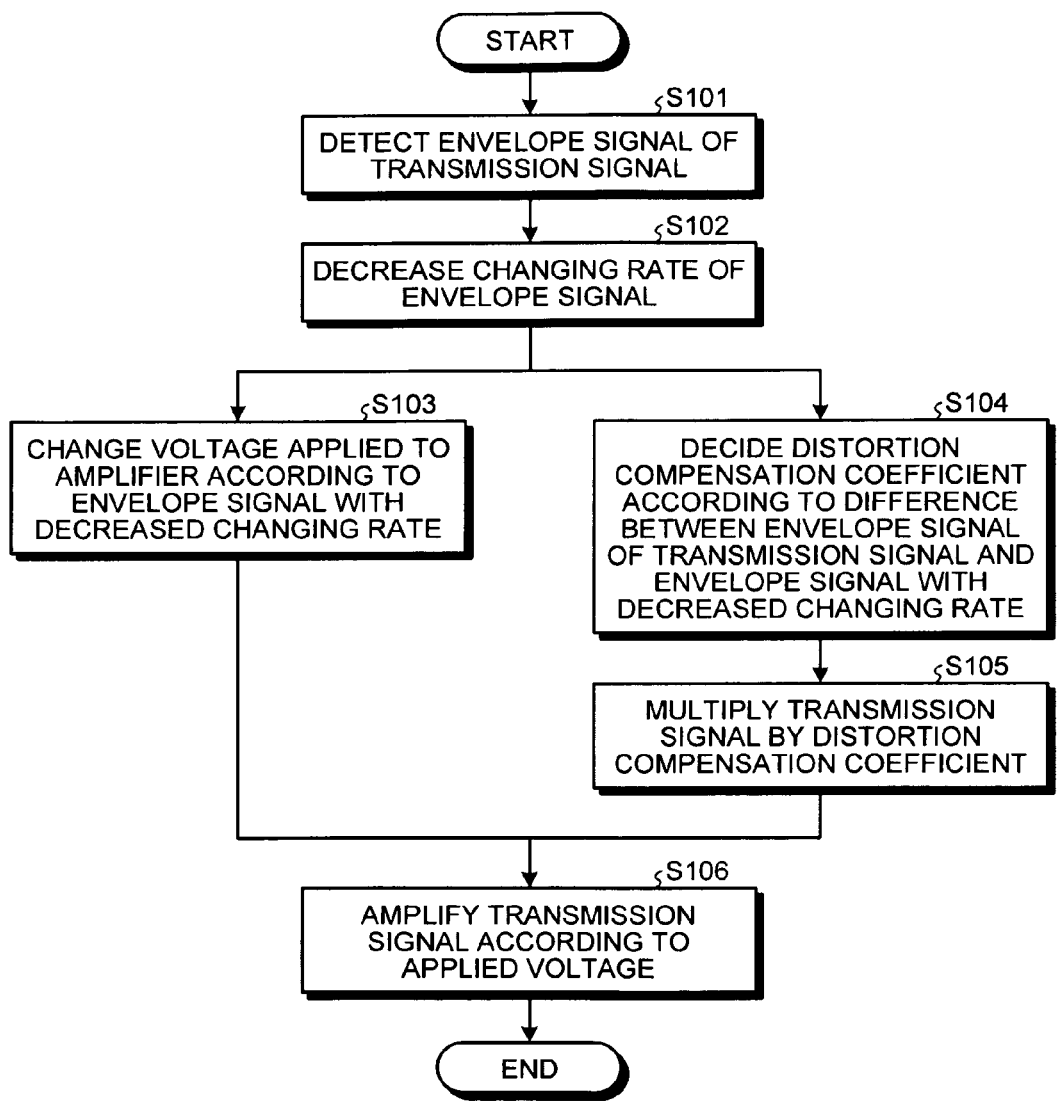
FIG. 2 is a flowchart of a procedure of a distortion compensation process performed by the transmission device according to the first embodiment.

Next, a distortion compensation process performed by the transmission device 10 according to the first embodiment will be explained below. FIG. 2 is a flowchart of a procedure of the distortion compensation process performed by the transmission device 10 according to the first embodiment.

As represented in FIG. 2, the envelope detector 102 of the transmission device 10 detects an envelope signal of the transmission signal (Step S101). The envelope detector 102 then outputs the detected envelope signal to the rate decreasing unit 103 and to the voltage-control-distortion compensation-coefficient deciding unit 105.

The rate decreasing unit 103 decreases the changing rate of the envelope signal detected by the envelope detector 102 (Step S102). The rate decreasing unit 103 then outputs the envelope signal with decreased changing rate to the voltage controller 104 and to the voltage-control-distortion compensation-coefficient deciding unit 105.

The voltage controller 104 changes the voltage applied to the amplifier 101 according to the envelope signal whose changing rate is decreased by the rate decreasing unit 103 (Step S103).

The voltage-control-distortion compensation-coefficient deciding unit 105 decides a voltage-control-distortion compensation coefficient according to the envelope signal detected by the envelope detector 102 and the envelope signal whose changing rate is decreased by the rate decreasing unit 103 (Step S104). Then, the voltage-control-distortion compensation-coefficient deciding unit 105 outputs the decided voltage-control-distortion compensation coefficient to the multiplier 106.

The multiplier 106 multiplies the transmission signal by the voltage-control-distortion compensation coefficient decided by the voltage-control-distortion compensation-coefficient deciding unit 105 (Step S105).

The amplifier 101 amplifies the transmission signal input from the multiplier 106 according to the voltage to be applied by the voltage controller 104, and outputs the amplified transmission signal to the transmission antenna 107 (Step S106).

As explained above, the transmission device 10 according to the first embodiment decreases the changing rate of the envelope signal of the transmission signal and changes the voltage applied to the amplifier 101 according to the envelope signal with the decreased changing rate. Therefore, the phase difference between the voltage applied to the amplifier 101 and the transmission signal input to the amplifier 101 can be reduced, and as a result of this the voltage-control distortion occurring in the amplifier 101 can be suppressed.

Furthermore, the transmission device 10 according to the first embodiment decides the distortion compensation coefficient for compensating for voltage-control distortion according to the envelope signal of the transmission signal and the envelope signal with decreased changing rate, and multiplies the transmission signal by the decided distortion compensation coefficient. Therefore, the voltage-control distortion occurring in the amplifier 101 can be further suppressed.

[b] Second Embodiment

The first embodiment represents the example of suppressing the voltage-control distortion occurring in the amplifier, however, both the nonlinear distortion and the voltage-control distortion occurring in the amplifier may be suppressed. Therefore, a second embodiment will explain a transmission device that suppresses both the nonlinear distortion and the voltage-control distortion occurring in the amplifier.

Figure 3:
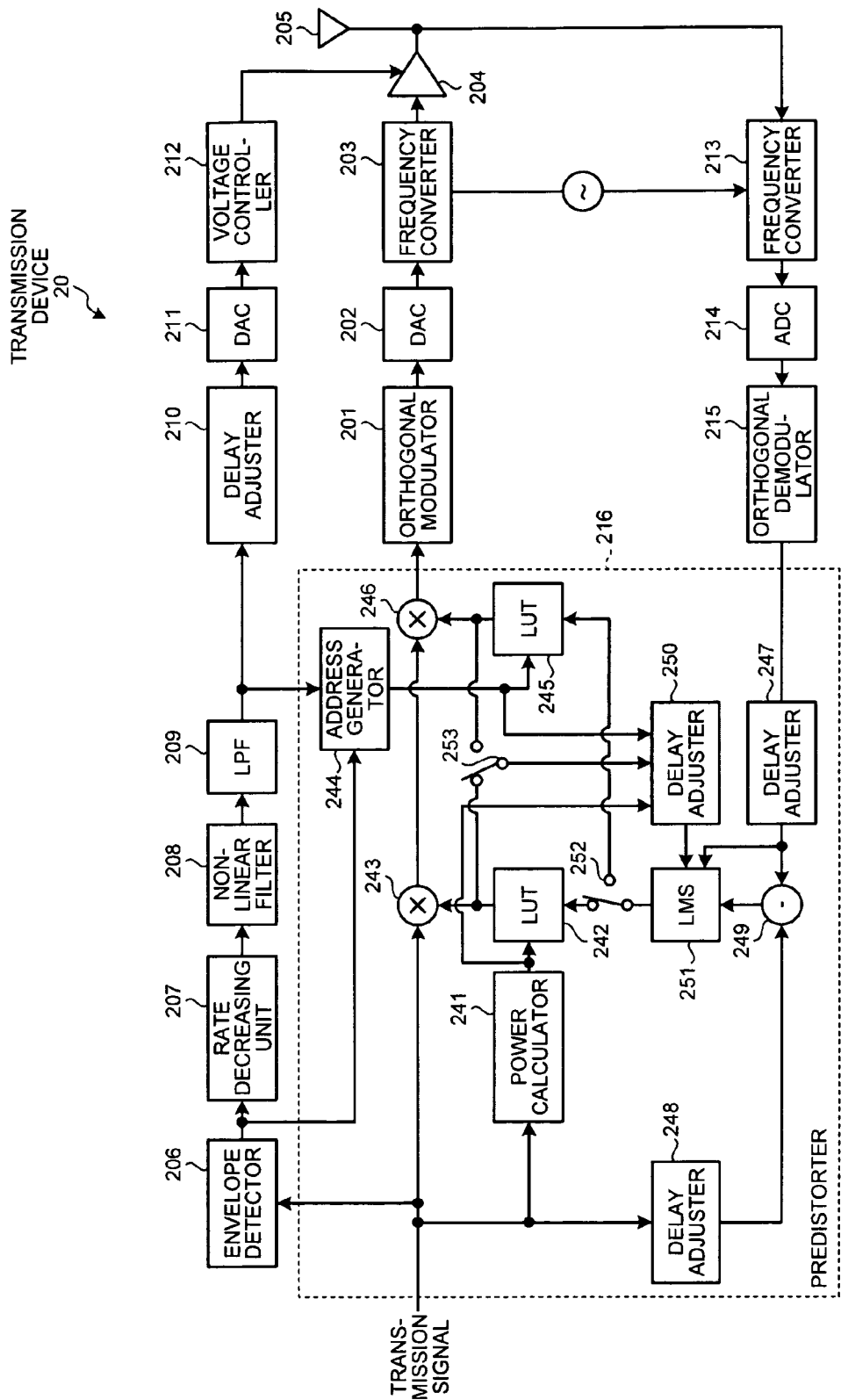
FIG. 3 is a diagram of a configuration of a transmission device according to a second embodiment.

Next, a configuration of a transmission device 20 according to the second embodiment will be explained below. FIG. 3 is a diagram of the configuration of the transmission device 20 according to the second embodiment.

As represented in FIG. 3, the transmission device 20 includes an orthogonal modulator 201, a DAC (Digital/Analog converter) 202, a frequency converter 203, an amplifier 204, a transmission antenna 205, an envelope detector 206, a rate decreasing unit 207, a nonlinear filter 208, an LPF (Low Pass Filter) 209, a delay adjuster 210, a DAC 211, a voltage controller 212, a frequency converter 213, an ADC (Analog/Digital Converter) 214, an orthogonal demodulator 215, and a predistorter 216.

The orthogonal modulator 201 orthogonally modulates the transmission signal subjected to distortion compensation by the predistorter 216 as explained later, and converts the orthogonally modulated transmission signal from a baseband to a signal of an IF (Intermediate Frequency) band. The DAC 202 converts the transmission signal converted to the IF band by the orthogonal modulator 201 to an analog signal. The frequency converter 203 converts the transmission signal of the IF band converted to the analog signal by the DAC 202 to a signal of an RF (Radio Frequency) band, and outputs the converted transmission signal to the amplifier 204.

The amplifier 204 amplifies the transmission signal input from the frequency converter 203 according to the voltage applied by the voltage controller 212, and outputs the amplified transmission signal to the transmission antenna 205. The amplifier 204 outputs part of the amplified transmission signal as a feedback signal to the frequency converter 213.

The envelope detector 206 detects an envelope signal of the transmission signal, and outputs the detected envelope signal to the rate decreasing unit 207.

Figure 4:
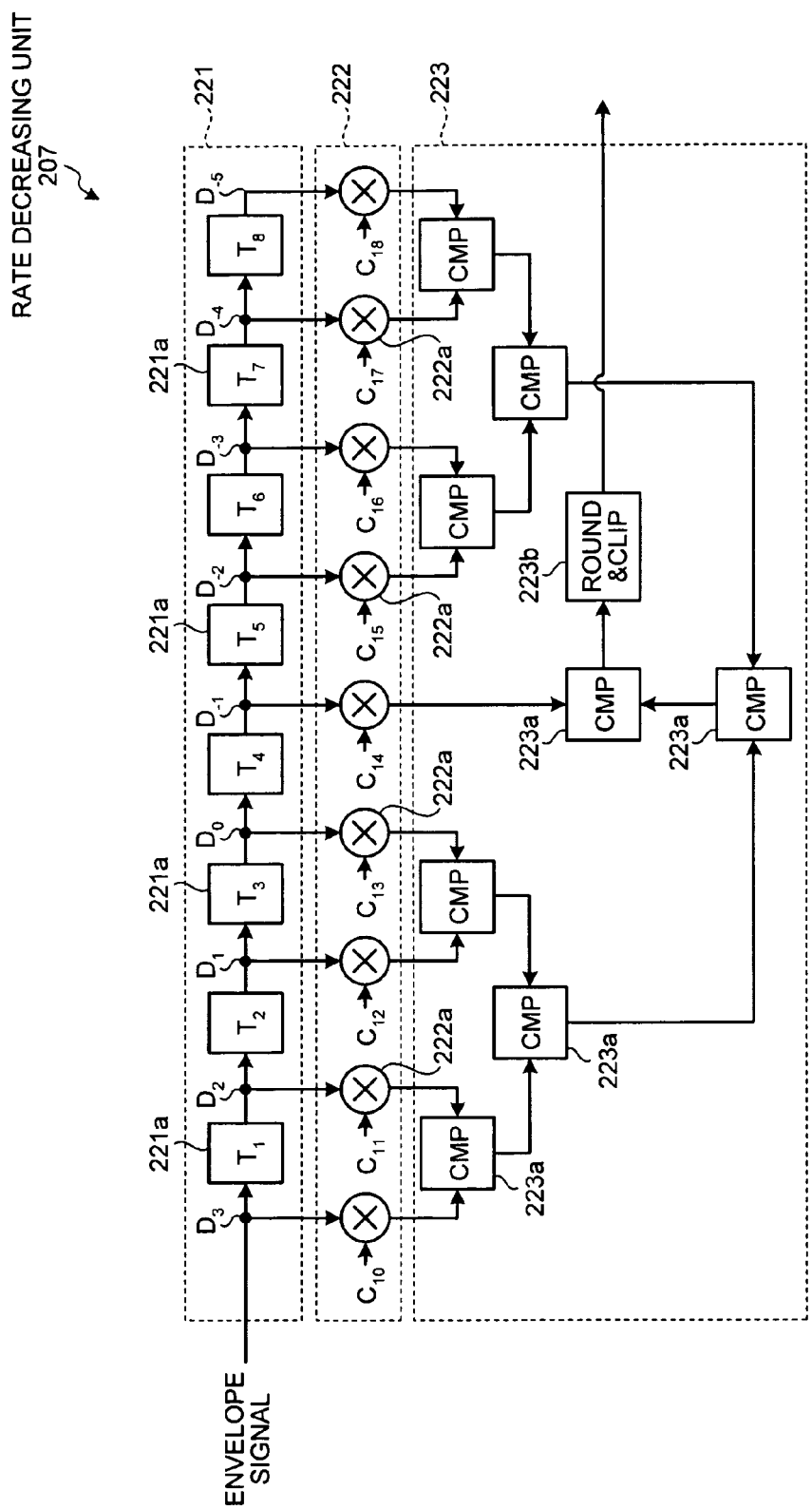
FIG. 4 is a detailed diagram of a rate decreasing unit represented in FIG. 3.

The rate decreasing unit 207 decreases a changing rate of the envelope signal detected by the envelope detector 206. Here, a configuration of the rate decreasing unit 207 will be explained below with reference to FIG. 4. FIG. 4 is a detailed diagram of the rate decreasing unit 207 represented in FIG. 3. As represented in FIG. 4, the rate decreasing unit 207 includes a shift register 221, a window-coefficient multiplying unit 222, and a tournament computing unit 223.

The shift register 221 is configured to serially connect a plurality (eight units in FIG. 4) of unit delay circuits 221a.

The shift register 221 serially passes the envelope signal input from the envelope detector 206 through the unit delay circuits 221a and provides a temporal delay to the envelope signal, to thereby acquire a plurality of envelope values which are temporally delayed from a current envelope value. In the example represented in FIG. 4, the shift register 221 acquires a total of nine envelope values ($D_3, D_2, \ldots, D_{-5}$), for the envelope signal input from the envelope detector 206, in which temporally previous eight envelope values from current data are sampled. It should be noted that $D(n-1)$ indicates the temporally previous data (it is delayed temporally by one) from $D(n)$ (where n: integer).

The window-coefficient multiplying unit 222 includes a plurality (nine units in FIG. 4) of multipliers 222a, and multiplies each of the envelope values sampled by the shift register 221 by each of window coefficients ($C_{10}$ to $C_{18}$ in FIG. 4) being weighting coefficients to thereby assign weights to the envelope values, respectively.

Furthermore, the window-coefficient multiplying unit 222 multiplies a redundant envelope value among the envelope values sampled by the shift register 221 by a window coefficient 0, to thereby narrow down the number of sampling data. For example, as represented in FIG. 4, the window-coefficient multiplying unit 222 multiplies a total of four envelope values being two values each from both ends, among the nine envelope values sampled by the shift register 221, by the window coefficient 0 (i.e., $C_{10}=C_{11}=C_{17}=C_{18}=0$), to thereby narrow down the number of envelope values to five ($D_1, D_0, \ldots, D_{-3}$).

Figure 5:
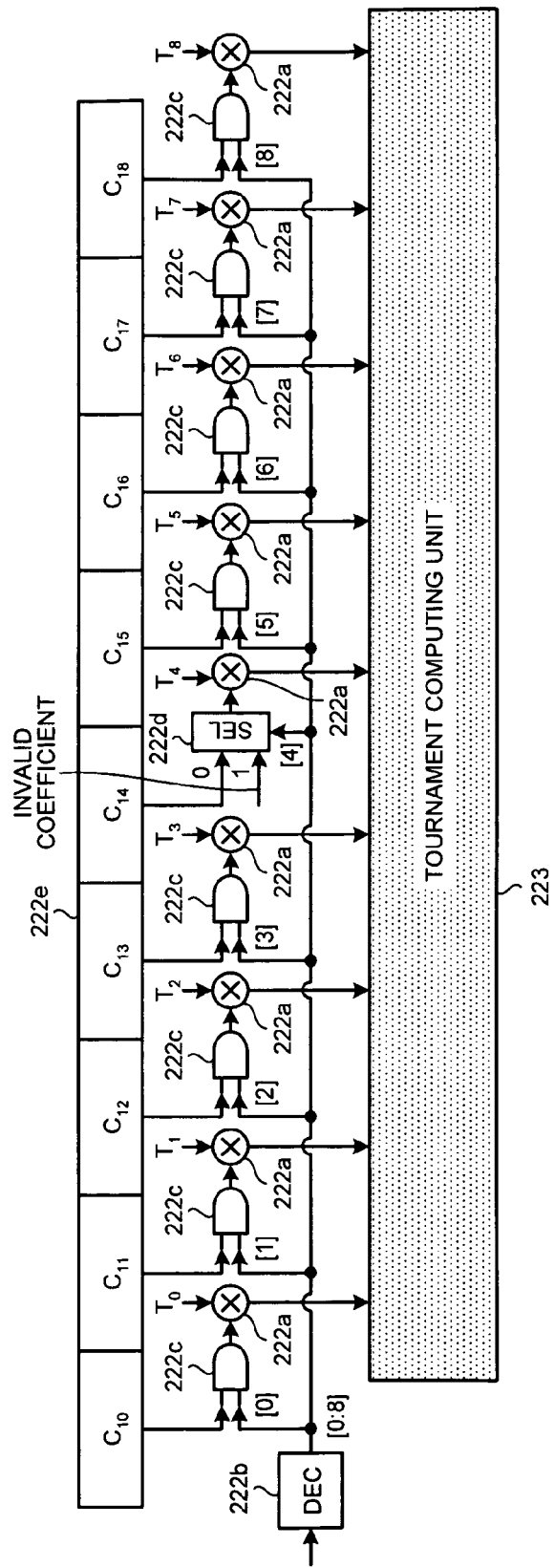
FIG. 5 is a diagram for explaining a multiplication process of a window coefficient performed by a window-coefficient multiplying unit.

FIG. 5 is a diagram for explaining a multiplication process of the window coefficient performed by the window-coefficient multiplying unit 222. The window-coefficient multiplying unit 222 decodes, by a decoder (DEC) 222b, a window-width parameter being a parameter for deciding a redundant envelope value among envelope values $T_0$ to $T_8$ acquired by the shift register 221, and outputs the decoded parameter to AND operation units 222c and a selector (SEL) 222d. The window-coefficient multiplying unit 222 operates the AND operation units 222c and the SEL 222d according to the window-width parameter, and outputs the window coefficients $C_{10}$ to $C_{18}$ read from a window-coefficient register 222e to the multipliers 222a respectively. This allows the multipliers 222a to multiply the envelope values $T_0$ to $T_8$ sampled by the shift register 221 by the window coefficients $C_{10}$ to $C_{18}$ respectively, and results of the multiplications are output to the tournament computing unit 223. If all the envelope values $T_0$ to $T_8$ are decided as redundant envelope values, or if the rate decreasing unit 207 is set to be invalid, the window-coefficient multiplying unit 222 sets the outputs of the AND operation units 222c to zero according to the window-width parameters and also sets the output of the SEL 222d to an invalid coefficient being a coefficient indicating that the output of the SEL 222d is invalid.

The tournament computing unit 223 includes a plurality (eight units in FIG. 4) of comparators (CMP) 223a and a round and clip processor 223b. Repeated among the CMPs 223a are processes for comparing two values of the envelope values input from the window-coefficient multiplying unit 222 and outputting an envelope value which is a larger one of the two values, and a maximum envelope value is thereby finally determined and the determined value is output to the round and clip processor 223b. In the example represented in FIG. 4, the CMP 223a determines the maximum envelope value among the five weighted envelope values ($D_1, D_0, \ldots, D_{-3}$) input from the window-coefficient multiplying unit 222.

The round and clip processor 223b outputs the maximum envelope value input from the CMP 223a to the nonlinear filter 208 at a predetermined sampling rate, to thereby decrease a change amount of the envelope signal per unit time.

Figure 6:
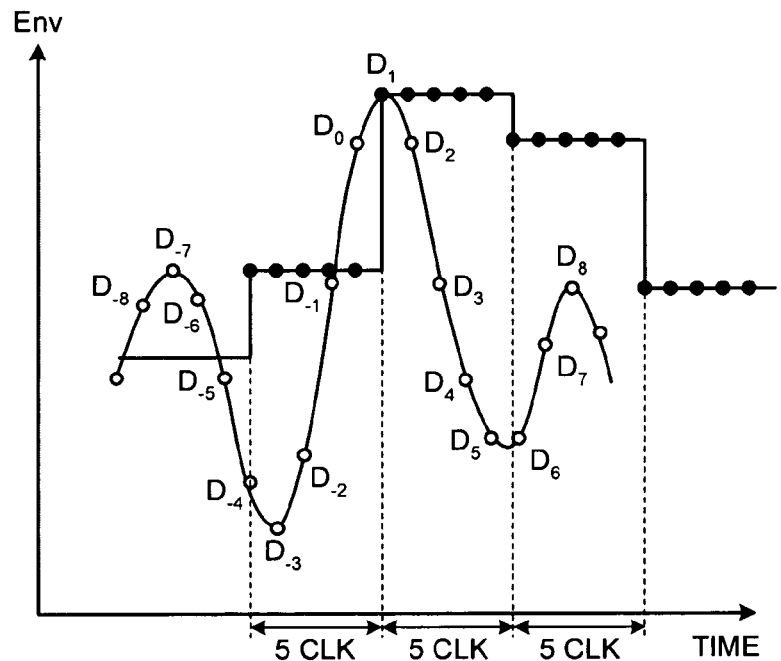
FIG. 6 is a diagram for explaining another example of a process performed by a round and clip processor.
Figure 7:
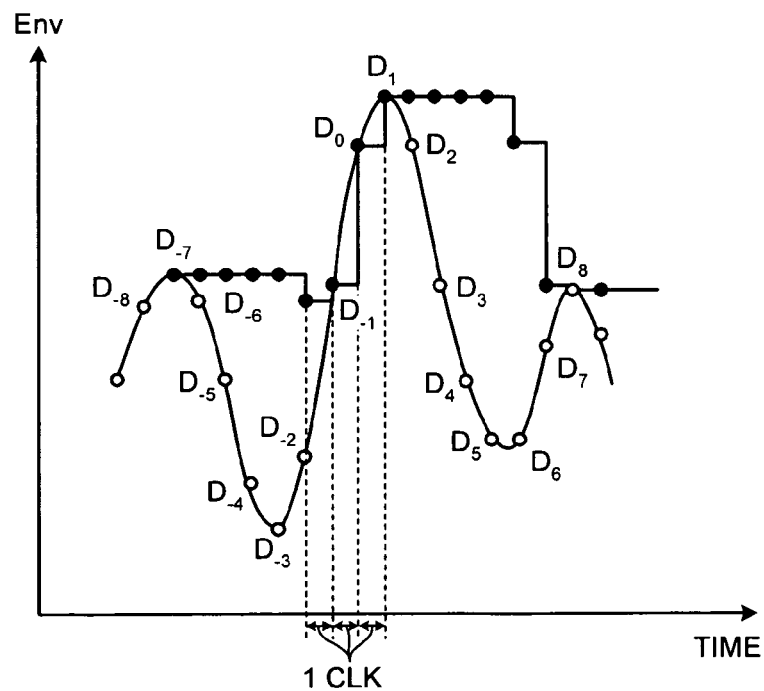
FIG. 7 is a diagram for explaining another example of a process performed by the round and clip processor.

FIGS. 6 and 7 are diagrams for explaining examples of processes performed by the round and clip processor 223b. It should be noted that the envelope values input from the shift register 221 are multiplied by the window coefficients $C_{10}=C_{11}=C_{17}=C_{18}=0$ and $C_{12}=C_{13}=C_{14}=C_{15}=C_{16}=1$ respectively by the window-coefficient multiplying unit 222, and the maximum value among the five envelope values is input to the round and clip processor 223b.

As represented in the example of FIG. 6, the round and clip processor 223b outputs the maximum envelope value input from the CMP 223a at the rate of once in five clocks. Furthermore, as represented in the example of FIG. 7, the round and clip processor 223b outputs the maximum envelope value input from the CMP 223a at the rate of once in one clock. By thus doing, the round and clip processor 223b decreases the change amount of the envelope signal per unit time. In other words, the round and clip processor 223b outputs the maximum envelope value input from the CMP 223a to the nonlinear filter 208 at a desired sampling rate and thereby decreases the changing rate of the envelope signal.

As explained above, the rate decreasing unit 207 causes the shift register 221, the window-coefficient multiplying unit 222, and the tournament computing unit 223 to cooperatively operate, and thereby decreases the changing rate of the envelope signal detected by the envelope detector 206.

Figure 8:
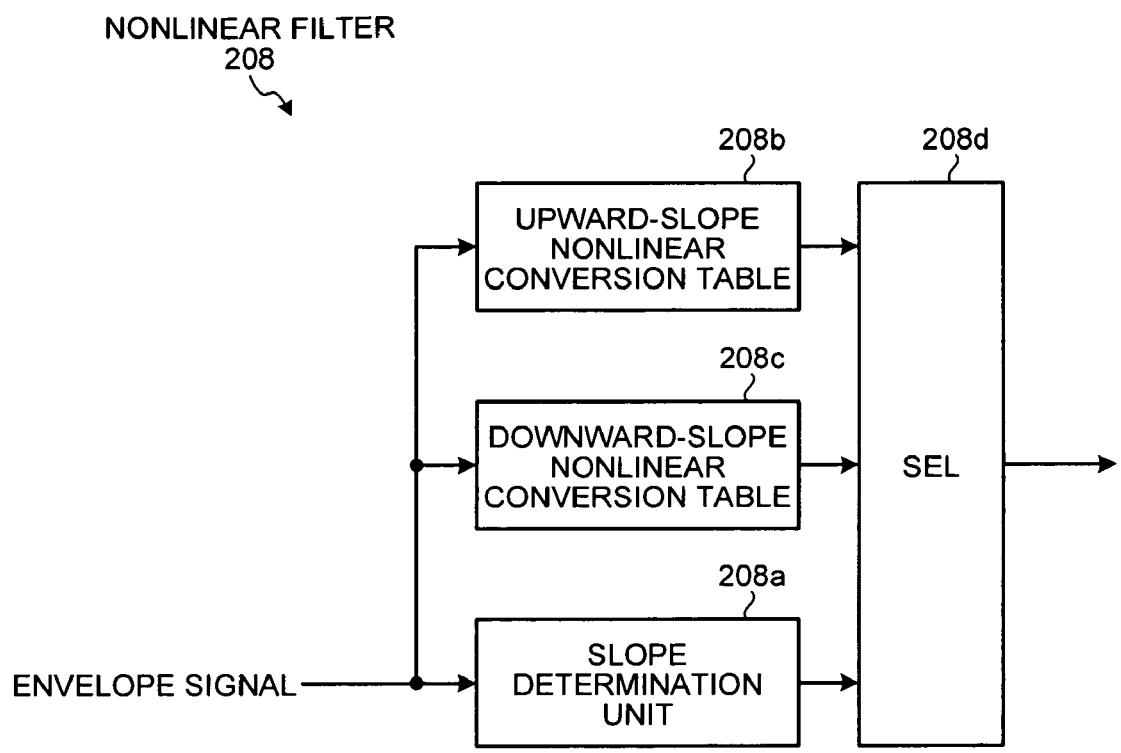
FIG. 8 is a detailed diagram of a nonlinear filter represented in FIG. 3.

Referring back to the explanation of FIG. 3, the nonlinear filter 208 smoothes the envelope signal whose changing rate is decreased by the rate decreasing unit 207. Here, a configuration of the nonlinear filter 208 will be explained with reference to FIG. 8. FIG. 8 is a detailed diagram of the nonlinear filter 208 represented in FIG. 3. As represented in FIG. 8, the nonlinear filter 208 includes a slope determination unit 208a, an upward-slope nonlinear conversion table 208b, a downward-slope nonlinear conversion table 208c, and a selector (SEL) 208d.

The slope determination unit 208a determines whether a slope of the envelope signal is an upward slope or a downward slope based on a previous envelope signal and a current envelope signal input from the rate decreasing unit 207, and outputs the result of determination to the SEL 208d. If the slope of the envelope signal is the upward slope, the upward-slope nonlinear conversion table 208b outputs a nonlinear conversion value according to the slope of the envelope signal to the SEL 208d. If the slope of the envelope signal is the downward slope, the downward-slope nonlinear conversion table 208c outputs a nonlinear conversion value according to the slope of the envelope signal to the SEL 208d. The SEL 208d selects either one of the output of the upward-slope nonlinear conversion table 208b and the output of the downward-slope nonlinear conversion table 208c according to the result of the determination from the slope determination unit 208a, and outputs the selected one to the LPF 209.

As explained above, the nonlinear filter 208 causes the slope determination unit 208a, the upward-slope nonlinear conversion table 208b, the downward-slope nonlinear conversion table 208c, and the SEL 208d to cooperatively operate, and thereby smoothes the envelope signal with the changing rate decreased by the rate decreasing unit 207.

Figure 9:
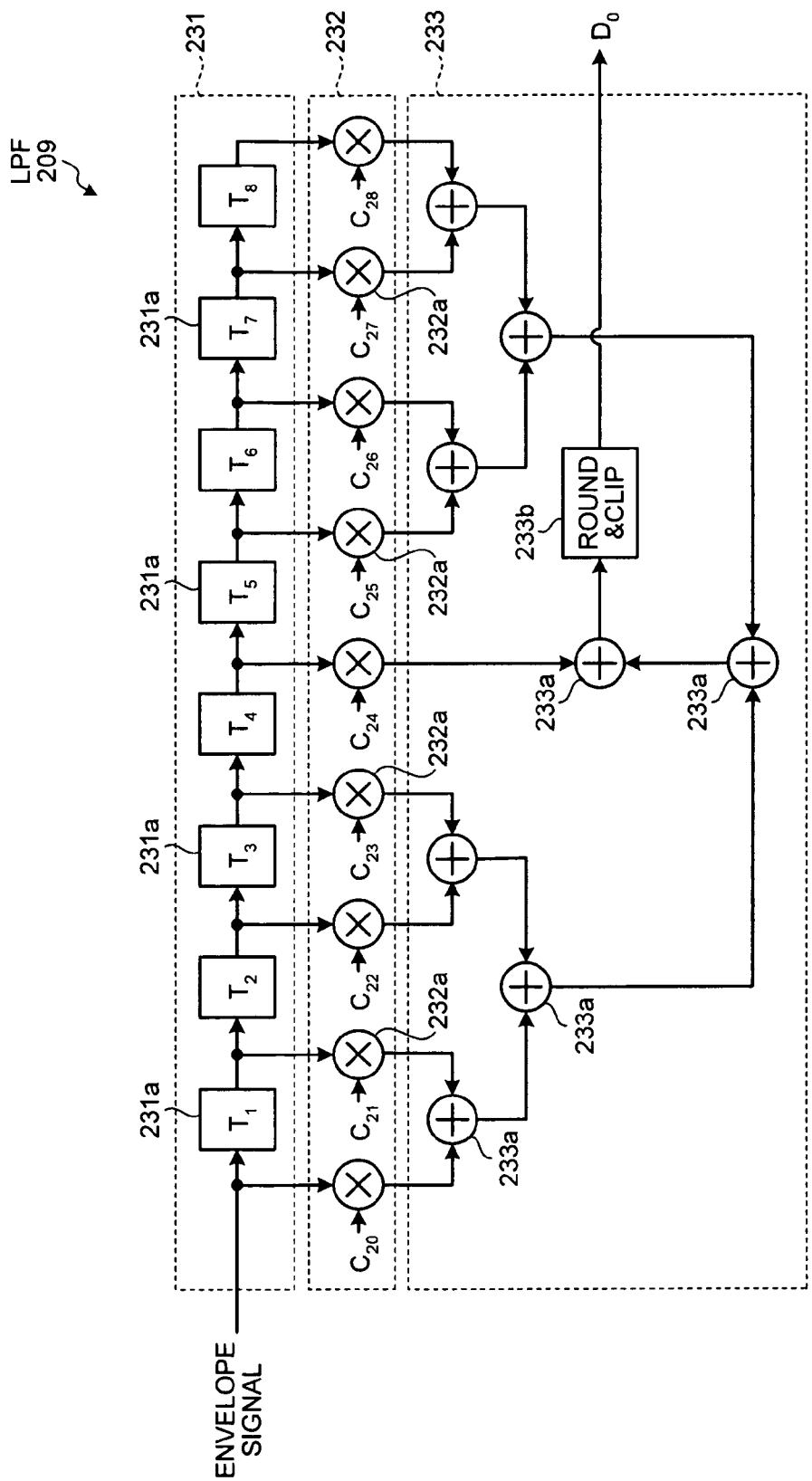
FIG. 9 is a detailed diagram of an LPF represented in FIG. 3.

Referring back to the explanation of FIG. 3, the LPF 209 removes a high-frequency component from the envelope signal smoothed by the nonlinear filter 208. Here, a configuration of the LPF 209 will be explained below with reference to FIG. 9. FIG. 9 is a detailed diagram of the LPF 209 represented in FIG. 3. As represented in FIG. 3, the LPF 209 includes a shift register 231, a filter-coefficient multiplying unit 232, and a tournament computing unit 233.

The shift register 231 is configured to serially connect a plurality (eight units in FIG. 9) of unit delay circuits 231a. The shift register 231 serially passes the envelope signal from which the high-frequency component is removed by the LPF 209 through the unit delay circuits 231a and provides a temporal delay to the envelope signal, to thereby acquire a plurality of envelope values which are temporally delayed from the current envelope value. In the example represented in FIG. 9, the shift register 231 acquires a total of nine envelope values as sampling data, for the envelope signal input from the nonlinear filter 208, in which temporally previous eight envelope values from the current data are sampled.

The filter-coefficient multiplying unit 232 includes a plurality (nine units in FIG. 9) of multipliers 232a, and multiplies each of the envelope values sampled by the shift register 231 by each of filter coefficients ($C_{21}$ to $C_{28}$ in FIG. 9) being weighting coefficients to thereby assign weights to the envelope values, respectively.

The tournament computing unit 233 includes a plurality (eight units in FIG. 9) of adders 233a and a round and clip processor 233b. Repeated among the adders 233a is a process for adding two values of the envelope values weighted by the filter-coefficient multiplying unit 232, and a sum of the weighted envelope values is thereby finally determined and the determined sum is output to the round and clip processor 233b.

The round and clip processor 233b outputs the sum of the envelope values input from the adder 233a to the nonlinear filter 208 at the same sampling rate as that of the round and clip processor 223b in the rate decreasing unit 207, to thereby remove the high-frequency component of the envelope signal.

As explained above, the LPF 209 causes the shift register 231, the filter-coefficient multiplying unit 232, and the tournament computing unit 233 to cooperatively operate, and thereby removes the high-frequency component of the envelope signal smoothed by the nonlinear filter 208.

Referring back to the explanation of FIG. 3, the delay adjuster 210 provides a delay to the envelope signal input from the LPF 209 so that input timings to the amplifier 204 of the voltage applied to the amplifier 204 by the voltage controller 212 and of the transmission signal input from the frequency converter 203 to the amplifier 204 coincide with each other. If the delay needs to be provided to the envelope signal input from the LPF 209 with clock-by-clock accuracy, the delay adjuster 210 is composed of shift registers or the like. Meanwhile, if the delay needs to be provided to the envelope signal input from the LPF 209 with accuracy of less than one clock, the delay adjuster 210 is composed of an FIR (Finite Impulse Response) filter or the like. The DAC 211 converts the envelope signal provided with the delay by the delay adjuster 210 to an analog signal and outputs the analog signal to the voltage controller 212.

The voltage controller 212 changes the voltage applied to the amplifier 204 according to the envelope signal input from the DAC 211 or according to the envelope signal whose changing rate is decreased by the rate decreasing unit 207. For example, the voltage controller 212 generates a pulse signal with a pulse width according to the envelope signal with decreased changing rate, and performs switching of the voltage applied to the amplifier 204 according to the pulse signal by using a predetermined switching element.

The frequency converter 213 converts a feedback signal of an RF band input from the amplifier 204 to a signal of an IF band. The ADC 214 converts the feedback signal whose band is converted to the IF band by the frequency converter 213 to a digital signal. The orthogonal demodulator 215 orthogonally demodulates the feedback signal converted to the digital signal by the ADC 214 and also converts the orthogonally demodulated feedback signal from the IF band to a signal of the baseband, and outputs the converted signal to the predistorter 216.

The predistorter 216 includes a power calculator 241, a lookup table (LUT) 242, a multiplier 243, an address generator 244, a LUT 245, a multiplier 246, a delay adjuster 247, a delay adjuster 248, a subtractor 249, a delay adjuster 250, and LMS (Least Mean Square) 251. It should be noted that the multiplier 243 and the multiplier 246 may be complex multipliers.

The power calculator 241 calculates a power value of the input transmission signal or an envelope signal thereof, and outputs the calculated power value of the transmission signal or the calculated envelope signal thereof (or two-dimensional address in which the two are combined, and hereinafter, "power value") to the LUT 242.

The LUT 242 decides a nonlinear-distortion compensation coefficient for compensating for nonlinear distortion occurring in the amplifier 204 caused by the nonlinear characteristic of the amplifier 204, according to the power value of the transmission signal calculated by the power calculator 241, and outputs the decided nonlinear-distortion compensation coefficient to the multiplier 243. For example, the LUT 242 stores therein a nonlinear-distortion compensation coefficient for each power value of the transmission signal, and outputs a nonlinear-distortion compensation coefficient corresponding to the power value input from the power calculator 241 to the multiplier 243.

The multiplier 243 multiplies the transmission signal by the nonlinear-distortion compensation coefficient decided by the LUT 242 to thereby compensate for nonlinear distortion occurring in the amplifier 204, and outputs the transmission signal in which nonlinear distortion is compensated for to the multiplier 246. If the multiplier 243 is provided as the complex multiplier, the multiplier 243 complex-multiplies the transmission signal by the nonlinear-distortion compensation coefficient decided by the LUT 242.

The address generator 244 generates a two-dimensional address for searching the LUT 245 using the envelope signal detected by the envelope detector 206 and the envelope signal whose changing rate is decreased by the rate decreasing unit 207, and outputs the generated address to the LUT 245.

The LUT 245 decides a voltage-control-distortion compensation coefficient for compensating for voltage-control distortion occurring in the amplifier 204 according to the address generated by the address generator 244, and outputs the decided voltage-control-distortion compensation coefficient to the multiplier 246. For example, the LUT 245 stores therein a voltage-control-distortion compensation coefficient for each address, and outputs a voltage-control-distortion compensation coefficient corresponding to the address input from the address generator 244 to the multiplier 246.

The multiplier 246 multiplies the transmission signal, which is input from the multiplier 243 and in which nonlinear distortion is compensated for, by the voltage-control-distortion compensation coefficient decided by the LUT 245 to thereby compensate for voltage-control distortion occurring in the amplifier 204. Furthermore, the multiplier 246 outputs the transmission signal in which nonlinear distortion and voltage-control distortion are compensated for to the orthogonal modulator 201. If the multiplier 246 is provided as the complex multiplier, the multiplier 246 complex-multiplies the transmission signal, which is input from the multiplier 243 and in which the nonlinear distortion is compensated for, by the voltage-control-distortion compensation coefficient decided by the LUT 245.

The delay adjuster 247 delays the feedback signal input from the orthogonal demodulator 215 with accuracy of less than one clock, and outputs the delayed feedback signal to the subtractor 249. The delay adjuster 248 delays the transmission signal with clock-by-clock accuracy, and outputs the delayed transmission signal to the subtractor 249. For example, the delay adjusters 247 and 248 discretely delay the transmission signal and the feedback signal of which timings are mutually shifted in order to compare the signals of the same time by the subtractor 249, so that input timings of the transmission signal and the feedback signal to the subtractor 249 are caused to coincide with each other.

The subtractor 249 performs subtraction of the transmission signal and the feedback signal of the same time at which the input timings are caused to coincide with each other by the delay adjusters 247 and 248, to determine a differential signal indicating a difference between the transmission signal input to the amplifier 204 and the transmission signal amplified by the amplifier 204. The subtractor 249 outputs the determined differential signal to the LMS 251.

The LMS 251 uses the differential signal input from the subtractor 249 to selectively update the voltage-control-distortion compensation coefficient decided by the LUT 242 or the nonlinear-distortion compensation coefficient decided by the LUT 245. For example, the LMS 251 switches between switches 252 and 253 to connect an input side of the LUT 242 and an output side of the LMS 251 and to connect an output side of the LUT 242 and an input side of the LMS 251 through the delay adjuster 250, so that addresses of the LUT 242 and the power calculator 241 are selected. The LMS 251 determines a new nonlinear-distortion compensation coefficient, as explained later, based on the differential signal input from the subtractor 249, the feedback signal input from the delay adjuster 247, and the nonlinear-distortion compensation coefficient (coefficient used to compensate for distortion of the transmission signal) of the same time input from the LUT 242 through the delay adjuster 250. Then, the LMS 251 updates the LUT 242 with the newly determined nonlinear-distortion compensation coefficient according to the address stored in the delay adjuster 250. The delay adjusters 247, 248, and 250 are for use to set the transmission signal, the distortion compensation coefficient and read-out address, and the feedback signal to the same time.

The LMS 251 switches between the switches 252 and 253 to connect an input side of the LUT 245 and the output side of the LMS 251 and to connect an output side of the LUT 245 and the input side of the LMS 251 through the delay adjuster 250, so that the LUT 245 is selected. The LMS 251 determines a new voltage-control-distortion compensation coefficient, as explained later, based on the differential signal input from the subtractor 249, the feedback signal input from the delay adjuster 247, and the current voltage-control-distortion compensation coefficient corresponding to the transmission signal input from the LUT 245 through the delay adjuster 250. Then, the LMS 251 updates the LUT 245 with the newly determined voltage-control-distortion compensation coefficient according to the address stored in the delay adjuster 250. In this manner, the updated nonlinear-distortion compensation coefficient and voltage-control-distortion compensation coefficient are output to the multipliers 243 and 246 respectively to be used for subsequent distortion compensation of the transmission signal.

As explained above, the LMS 251 uses the differential signal between the transmission signal input to the amplifier 204 and the transmission signal amplified by the amplifier 204 to selectively update the voltage-control-distortion compensation coefficient decided by the LUT 242 or the nonlinear-distortion compensation coefficient decided by the LUT 245.

Figure 10:
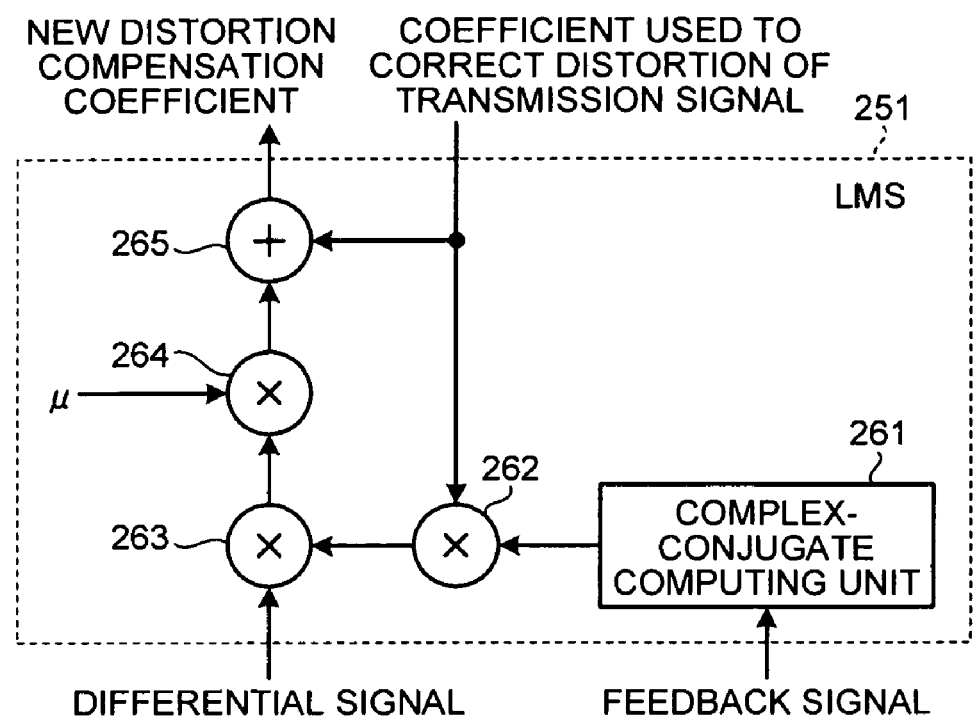
FIG. 10 is a detailed diagram of an LMS represented in FIG. 3.

Here, a detailed configuration of the LMS 251 to determine a new nonlinear-distortion compensation coefficient or a new voltage-control-distortion compensation coefficient will be explained below with reference to FIG. 10. FIG. 10 is a detailed diagram of the LMS 251 represented in FIG. 3. It should be noted that in FIG. 10, both the nonlinear-distortion compensation coefficient and the voltage-control-distortion compensation coefficient are called "distortion compensation coefficient".

As represented in FIG. 10, the LMS 251 includes a complex-conjugate computing unit 261, complex multipliers 262 to 263, a multiplier 264, and an adder 265. The complex-conjugate computing unit 261 computes a complex conjugate of the feedback signal input from the delay adjuster 247. The complex multiplier 262 complex-multiplies the complex conjugate of the feedback signal input from the complex-conjugate computing unit 261 and the current distortion compensation coefficient (coefficient used to compensate for distortion of the transmission signal) corresponding to the transmission signal input from the LUT 242 or the LUT 245 through the delay adjuster 250. The complex multiplier 263 complex-multiplies the result of complex-multiplication input from the complex multiplier 262 and the differential signal input from the subtractor 249. The multiplier 264 multiplies the result of complex-multiplication input from the complex multiplier 263 by step size parameter μ. The adder 265 adds the current distortion compensation coefficient corresponding to the transmission signal input from the LUT 242 or the LUT 245 through the delay adjuster 250 to the result of multiplication input from the multiplier 264, thereby determining a new distortion compensation coefficient.

By repeating the computing processes performed by the complex-conjugate computing unit 261, the complex multipliers 262 to 263, the multiplier 264, and the adder 265, the LMS 251 determines a new distortion compensation coefficient so that the differential signal input from the subtractor 249 becomes a minimum. Then, the LMS 251 updates the current distortion compensation coefficient corresponding to the transmission signal decided by the LUT 242 or the LUT 245 with the determined new distortion compensation coefficient.

Figure 11:
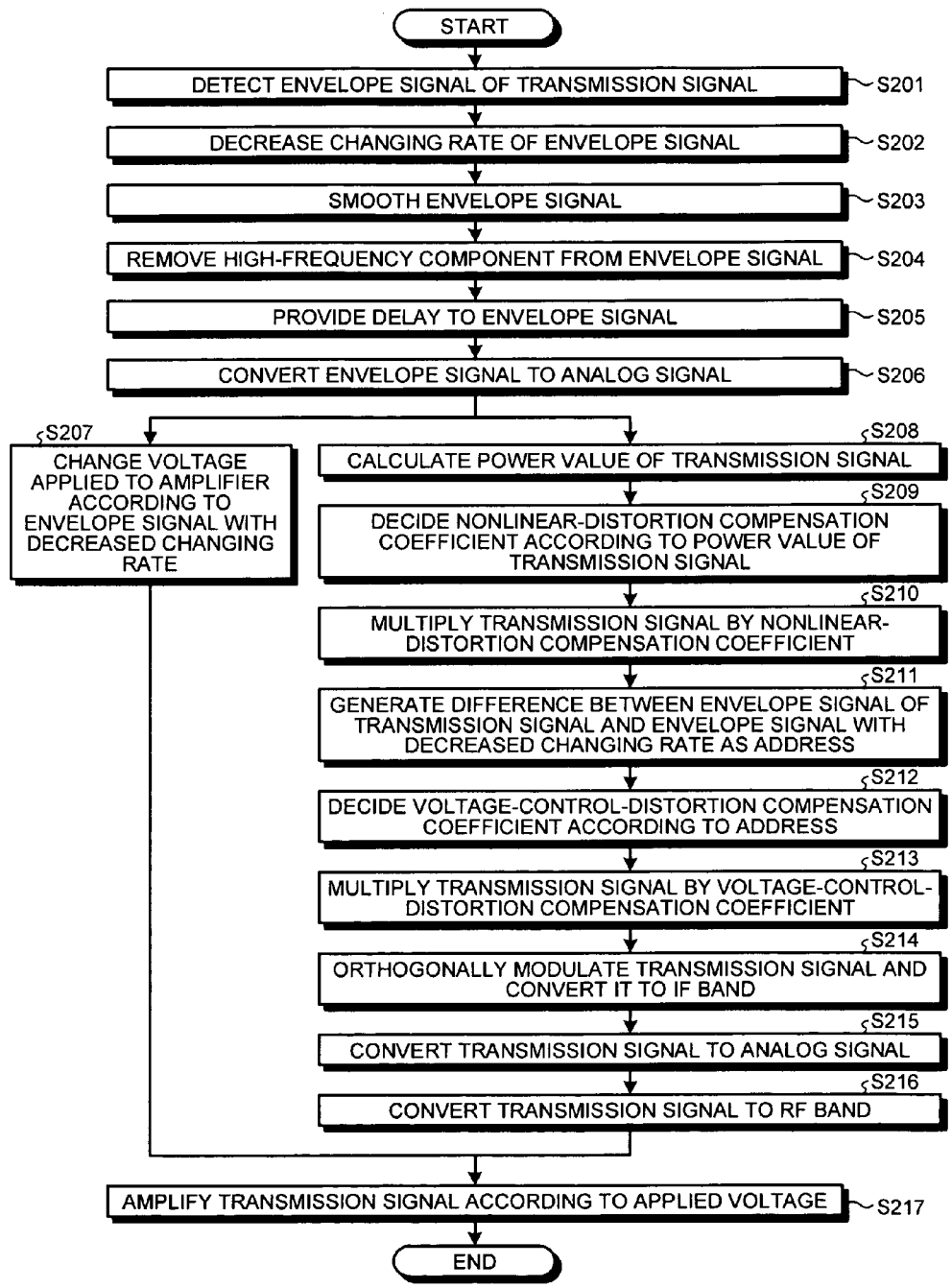
FIG. 11 is a flowchart of a procedure of a distortion compensation process performed by the transmission device according to the second embodiment.

Next, a distortion compensation process performed by the transmission device 20 according to the second embodiment will be explained below. FIG. 11 is a flowchart of a procedure of the distortion compensation process performed by the transmission device 20 according to the second embodiment.

As represented in FIG. 11, the envelope detector 206 of the transmission device 20 detects an envelope signal of the transmission signal (Step S201). Then, the envelope detector 206 outputs the detected envelope signal to the rate decreasing unit 207 and the address generator 244.

The rate decreasing unit 207 decreases the changing rate of the envelope signal detected by the envelope detector 206 (Step S202). For example, the rate decreasing unit 207 acquires a plurality of envelope values temporally delayed from the envelope value input from the envelope detector 206, assigns weights to the acquired envelope values, and then, determines a maximum envelope value among these envelope values. The rate decreasing unit 207 outputs the determined maximum value of the envelope value to the nonlinear filter 208 at a predetermined sampling rate, and thereby decreases the changing rate of the envelope signal.

The nonlinear filter 208 smoothes the envelope signal whose changing rate is decreased by the rate decreasing unit 207 (Step S203), and the LPF 209 removes the high-frequency signal component from the envelope signal smoothed by the nonlinear filter 208 (Step S204). Then, the LPF 209 outputs the envelope signal from which the high-frequency component is removed to the delay adjuster 210 and the address generator 244.

The delay adjuster 210 provides a delay to the envelope signal input from the LPF 209 (Step S205), and the DAC 211 converts the envelope signal input from the delay adjuster 210 to an analog signal (Step S206) and outputs the analog signal to the voltage controller 212.

The voltage controller 212 changes the voltage applied to the amplifier 204 according to the envelope signal input from the DAC 211 or according to the envelope signal whose changing rate is decreased by the rate decreasing unit 207 (Step S207).

The power calculator 241 calculates a power value of the input transmission signal (Step S208). The power calculator 241 then outputs the calculated power value of the transmission signal to the LUT 242. The power value is used as a new distortion-compensation-coefficient update address, and therefore it is output to the delay adjuster 250 in synchronization with a timing of the read distortion compensation coefficient.

The LUT 242 decides a nonlinear-distortion compensation coefficient for compensating for nonlinear distortion occurring in the amplifier 204 caused by the nonlinear characteristic of the amplifier 204, according to the power value of the transmission signal (Step S209). The LUT 242 then outputs the decided nonlinear-distortion compensation coefficient to the multiplier 243.

The multiplier 243 multiplies the transmission signal by the nonlinear-distortion compensation coefficient, to thereby compensate for the nonlinear distortion occurring in the amplifier 204 (Step S210). The multiplier 243 outputs the transmission signal in which the nonlinear distortion is compensated for to the multiplier 246.

The address generator 244 generates a two-dimensional address for searching the LUT 245 using the envelope signal detected by the envelope detector 206 and the envelope signal whose changing rate is decreased by the rate decreasing unit 207, and outputs the generated address to the LUT 245 (Step S211). This address is used as a new distortion-compensation-coefficient update address, and therefore it is output to the delay adjuster 250 in synchronization with a timing of the read distortion compensation coefficient.

The LUT 245 decides a voltage-control-distortion compensation coefficient for compensating for voltage-control distortion occurring in the amplifier 204 according to the address input from the address generator 244 (Step S212). The LUT 245 then outputs the decided voltage-control-distortion compensation coefficient to the multiplier 246.

The multiplier 246 multiplies the transmission signal, which is input from the multiplier 243 and in which the nonlinear distortion is compensated for, by the voltage-control-distortion compensation coefficient to thereby compensate for voltage-control distortion occurring in the amplifier 204 (Step S213). The multiplier 246 then outputs the transmission signal in which the nonlinear distortion and the voltage-control distortion are compensated for to the orthogonal modulator 201.

The orthogonal modulator 201 orthogonally modulates the transmission signal input from the multiplier 246 and converts the transmission signal to a signal of an IF band (Step S214). The DAC 202 converts the transmission signal converted to that of the IF band to an analog signal (Step S215), and the frequency converter 203 converts the transmission signal converted to the analog signal to a signal of an RF band, and outputs the converted transmission signal to the amplifier 204 (Step S216).

The amplifier 204 amplifies the transmission signal input from the frequency converter 203 according to the voltage applied by the voltage controller 212, and outputs the amplified transmission signal to the transmission antenna 205 (Step S217).

As explained above, the transmission device 20 according to the second embodiment, similarly to the first embodiment, decreases the changing rate of the envelope signal of the transmission signal, and changes the voltage applied to the amplifier according to the envelope signal with decreased changing rate. Therefore, a phase difference between the voltage applied to the amplifier and the transmission signal input to the amplifier can be reduced, and, as a result, the voltage-control distortion occurring in the amplifier can be suppressed.

Furthermore, the transmission device 20 according to the second embodiment is discretely provided with the LUT for deciding the nonlinear-distortion compensation coefficient and the LUT for deciding the voltage-control-distortion compensation coefficient, to selectively update the nonlinear-distortion compensation coefficient or the voltage-control-distortion compensation coefficient. Therefore, as compared with a configuration in which the nonlinear-distortion compensation coefficient and the voltage-control-distortion compensation coefficient are stored in one LUT using a multidimensional address, an increase in the circuit scale of the LUT can be suppressed, and, as a result, the device can be reduced in size as much as possible.

[c] Third Embodiment

The second embodiment has represented the configuration example in which the rate decreasing unit 207 and the LPF 209 are separately provided, however, a part of the circuits of the LPF 209 and the LPF 209 may be shared. Therefore, a third embodiment will explain a transmission device in which a part of the circuits of the rate decreasing unit 207 and the LPF 209 is shared.

Figure 12:
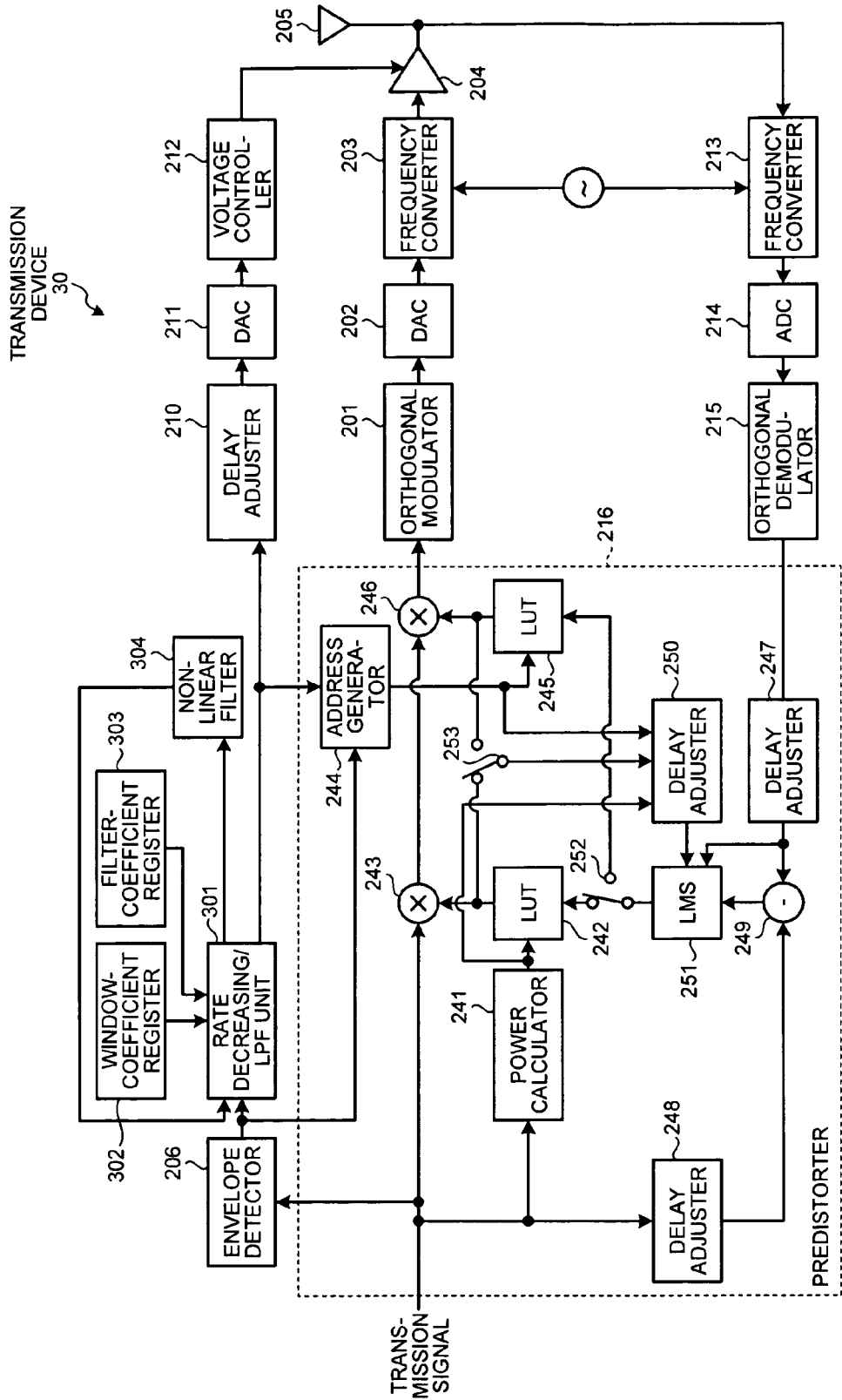
FIG. 12 is a diagram of a configuration of a transmission device according to a third embodiment.

First, a configuration of a transmission device 30 according to the third embodiment will be explained below. FIG. 12 is a diagram of the configuration of the transmission device 30 according to the third embodiment. Hereinafter, the same numerals are assigned to portions having the same functions as these of the component portions represented in FIG. 3, and detailed explanation thereof is omitted.

As represented in FIG. 12, the transmission device 30 are newly provided with a rate decreasing/LPF unit 301, a window-coefficient register 302, a filter-coefficient register 303, and a nonlinear filter 304 in place of the rate decreasing unit 207, the nonlinear filter 208, and the LPF 209 represented in FIG. 3.

The rate decreasing/LPF unit 301, similarly to the rate decreasing unit 207 represented in FIG. 3, decreases the changing rate of the envelope signal detected by the envelope detector 206, and, similarly to the LPF 209, removes the high-frequency component included in the envelope signal with decreased changing rate. It should be noted that a configuration of the rate decreasing/LPF unit 301 will be explained in detail later.

The window-coefficient register 302 stores therein a plurality of window coefficients (here, eight window coefficients $C_{10}$ to $C_{18}$). The filter-coefficient register 303 stores therein a plurality of filter coefficients (here, eight coefficients $C_{20}$ to $C_{28}$).

The nonlinear filter 304 is a filter having the same configuration as that of the nonlinear filter 208 represented in FIG. 3 and FIG. 8, which smoothes the envelope signal whose changing rate is decreased by the rate decreasing/LPF unit 301 and returns again the smoothed envelope signal to the rate decreasing/LPF unit 301. The envelope signal returned from the nonlinear filter 304 to the rate decreasing/LPF unit 301 is output to the delay adjuster 210 after the high-frequency component is removed therefrom by the rate decreasing/LPF unit 301 as explained later.

Figure 13:
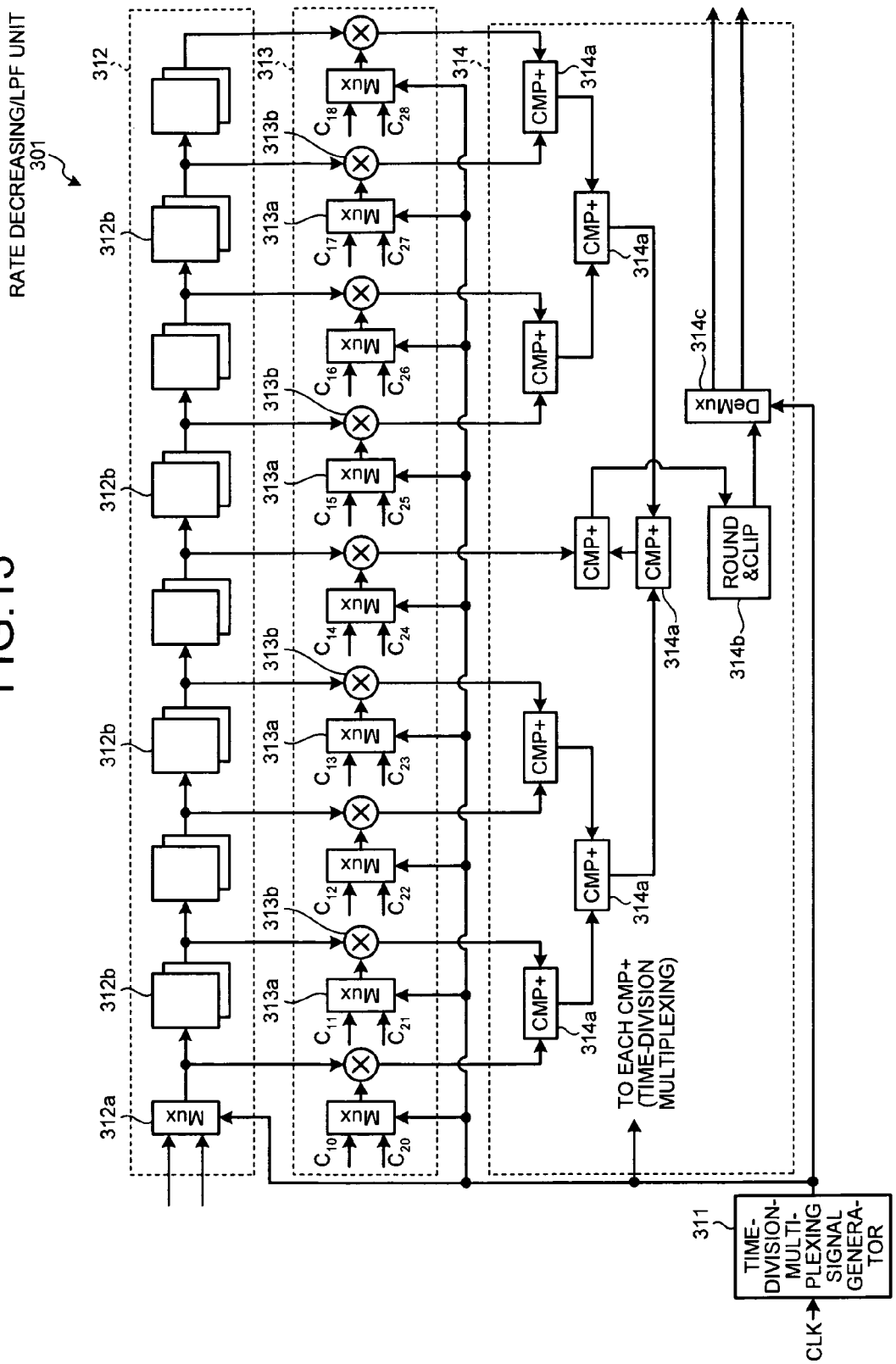
FIG. 13 is a detailed diagram of a rate decreasing/LPF unit represented in FIG. 12.

Here, the configuration of the rate decreasing/LPF unit 301 will be explained below with reference to FIG. 13. FIG. 13 is a detailed diagram of the rate decreasing/LPF unit 301 represented in FIG. 12. As represented in FIG. 13, the rate decreasing/LPF unit 301 includes a time-division-multiplexing signal generator 311, a shift register 312, a coefficient multiplier 313, and a tournament computing unit 314.

The time-division-multiplexing signal generator 311 generates a time-division-multiplexing signal being a control signal obtained by dividing the frequency of double-sampling clock by two, and transmits the generated time-division-multiplexing signal to the shift register 312, the coefficient multiplier 313, and the tournament computing unit 314.

The shift register 312 is configured to serially connect a plurality (eight units in FIG. 13) of unit delay circuits 312b with respect to a multiplexer (Mux) 312a. The shift register 312 multiplexes the envelope signal input from the envelope detector 206 and the envelope signal input from the nonlinear filter 304 in the multiplexer 312a. Moreover, the shift register 312 selectively outputs either one of the multiplexed envelope signals from the multiplexer 312a according to the time-division-multiplexing signal received from the time-division-multiplexing signal generator 311. For example, if the time-division-multiplexing signal has an odd number of clock pulses, the shift register 312 outputs the envelope signal received from the envelope detector 206 from the multiplexer 312a, and outputs the envelope signal received from the nonlinear filter 304 therefrom if the time-division-multiplexing signal has an even number of clock pulses. The shift register 312 causes either one of the envelope signals output from the multiplexer 312a to sequentially pass through the unit delay circuits 312b and acquires a plurality of envelope values delayed from the current envelope value. In the example represented in FIG. 13, the shift register 312 acquires a total of nine envelope values in which temporally previous eight envelope values from the current data are sampled.

The coefficient multiplier 313 includes a plurality (nine units in FIG. 13) of multiplexers 313a and a plurality (nine units in FIG. 13) of multipliers 313b each corresponding to each of the multiplexers. The coefficient multiplier 313 multiplexes the window coefficients ($C_{11}$ to $C_{18}$ in FIG. 13) input from the window-coefficient register 302 and the filter coefficients ($C_{21}$ to $C_{28}$ in FIG. 13) input from the filter-coefficient register 303 in the multiplexer 313a. Moreover, the coefficient multiplier 313 selectively outputs either one of the multiplexed window coefficient and filter coefficient from the multiplexer 313a to the multiplier 313b according to the time-division-multiplexing signal received from the time-division-multiplexing signal generator 311. For example, if the time-division-multiplexing signal has an odd number of clock pulses, the coefficient multiplier 313 outputs the window coefficient from the multiplexer 313a to the multiplier 313b and outputs the filter coefficient from the multiplexer 313a to the multiplier 313b if the time-division-multiplexing signal has an even number of clock pulses. The coefficient multiplier 313 multiplies each of the envelope values input from the shift register 312 by either one of the coefficients output from the multiplexer 313a to assign weights to the envelope values respectively. When the window coefficient is to be output from the multiplexer 313a, the coefficient multiplier 313 multiplies a redundant envelope value among the envelope values sampled by the shift register 312 by a window coefficient 0, to adjust the number of sampling data.

The tournament computing unit 314 includes a plurality (eight units in FIG. 13) of comparator/adder units (CMP+) 314a, a round and clip processor 314b, and a demultiplexer (DeMux) 314c. The comparator/adder unit 314a selectively operates as a comparator or an adder according to the time-division-multiplexing signal input from the time-division-multiplexing signal generator 311. For example, if the time-division-multiplexing signal has an odd number of clock pulses, the comparator/adder unit 314a operates as the comparator. For example, the comparator/adder unit 314a compares each two values of the envelope values weighted by the coefficient multiplier 313, repeatedly performs the process of outputting the envelope value larger than the other in the two values, to thereby finally determine a maximum envelope value, and outputs the determined value to the round and clip processor 314b. Meanwhile, if the time-division-multiplexing signal has an even number of clock pulses, the comparator/adder unit 314a operates as the adder. For example, the comparator/adder unit 314a repeatedly performs the process of adding each two values of the envelope values weighted by the coefficient multiplier 313, to thereby finally determine a sum of weighted envelope values, and outputs the determined value to the round and clip processor 314b. It should be noted that a configuration of the comparator/adder unit 314a will be explained in detail later.

The round and clip processor 314b outputs the maximum envelope value input from the comparator/adder unit 314a to the demultiplexer 314c at a predetermined sampling rate, to thereby decrease the changing rate of the envelope signal. Furthermore, the round and clip processor 314b outputs the sum of the envelope values input from the comparator/adder unit 314a to the demultiplexer 314c at the predetermined sampling rate, to thereby remove the high-frequency component from the envelope signal.

The demultiplexer 314c separates the envelope signal input from the round and clip processor 314b into the envelope signal whose changing rate is decreased and the envelope signal from which the high-frequency component is removed, according to the time-division-multiplexing signal input from the time-division-multiplexing signal generator 311. For example, if the time-division-multiplexing signal has an odd number of clock pulses, the demultiplexer 314c separates the envelope signal whose changing rate is decreased and outputs the separated signal to the nonlinear filter 304. Meanwhile, if the time-division-multiplexing signal has an even number of clock pulses, the demultiplexer 314c separates the envelope signal from which the high-frequency component is removed and outputs the separated signal to the address generator 244 and the delay adjuster 210.

As explained above, the rate decreasing/LPF unit 301 decreases the changing rate of the envelope signal detected by the envelope detector 206 and also removes the high-frequency component included in the envelope signal with decreased changing rate.

Figure 14:
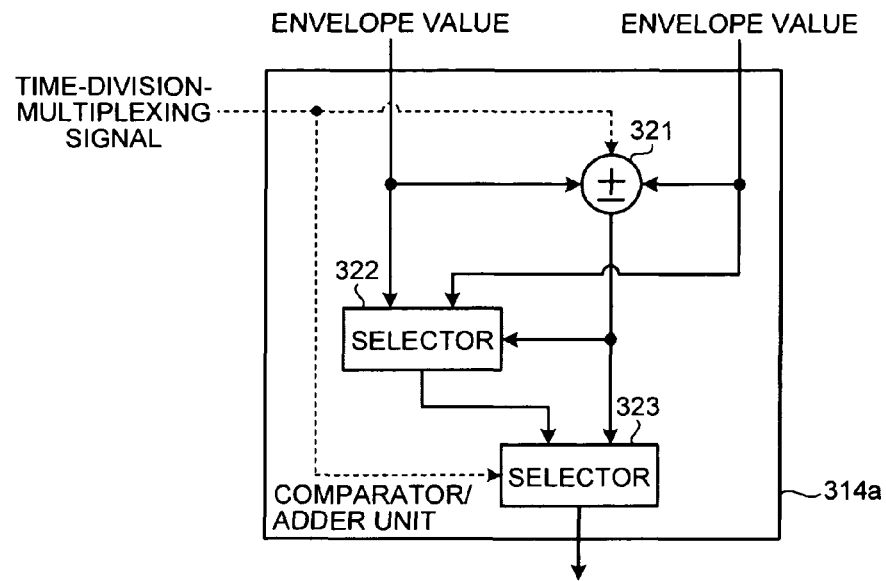
FIG. 14 is a detailed diagram of a comparator/adder unit (CMP+) represented in FIG. 13.
Figure 15:
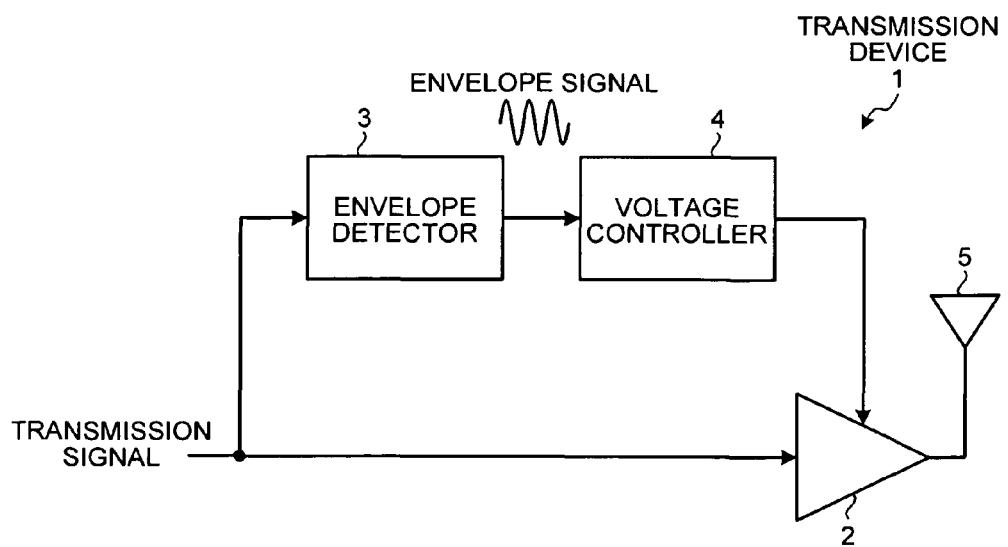
FIG. 15 is a diagram of a configuration of the conventional transmission device.
Figure 16:
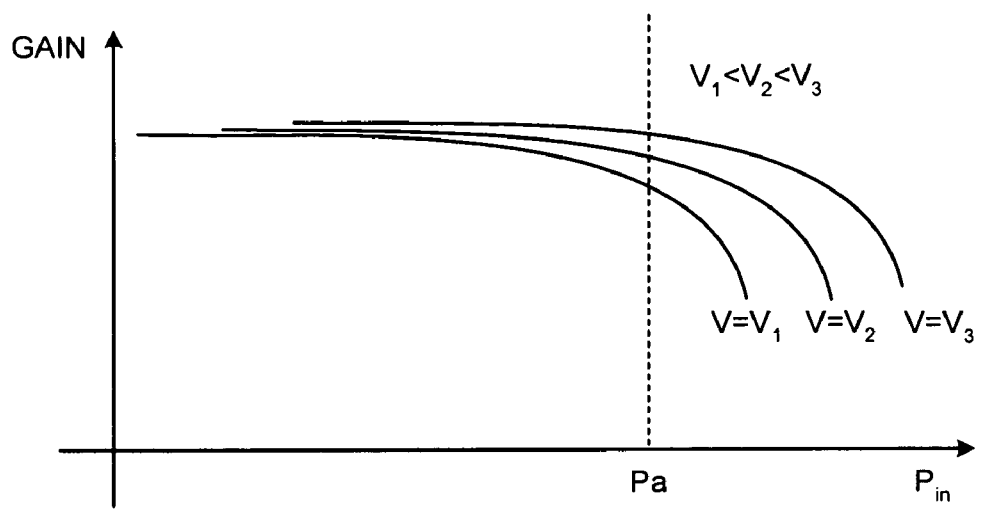
FIG. 16 is a diagram of schematic input/output gain characteristics of an amplifier.

Here, the configuration of the comparator/adder unit 314a will be explained below with reference to FIG. 14. FIG. 14 is a detailed diagram of the comparator/adder unit 314a represented in FIG. 13. The comparator/adder unit 314a includes an adder/subtractor 321, a comparison result selector (Max selector) 322, and a comparison/addition result selector (SEL) 323.

The adder/subtractor 321 selectively operates as a subtractor or an adder according to the time-division-multiplexing signal input from the time-division-multiplexing signal generator 311. For example, if the time-division-multiplexing signal has an odd number of clock pulses, the adder/subtractor 321 operates as the subtractor, subtracts two input envelope signals, and outputs the result of subtraction to the comparison result selector 322. Meanwhile, if the time-division-multiplexing signal has an even number of clock pulses, the adder/subtractor 321 operates as the adder, adds two input envelope signals, and outputs the result of addition to the comparison/addition result selector 323.

The comparison result selector 322 compares magnitudes of the input two envelope values according to positive or negative of the result of subtraction input from the adder/subtractor 321, and outputs a larger one of the envelope values as a result of comparison to the comparison/addition result selector 323.

The comparison/addition result selector 323 selectively outputs the result of comparison of the envelope values input from the comparison result selector 322 and the result of addition of the envelope values input from the adder/subtractor 321 according to the time-division-multiplexing signal input from the time-division-multiplexing signal generator 311. For example, if the time-division-multiplexing signal has an odd number of clock pulses, the comparison/addition result selector 323 outputs the result of comparison between the envelope values input from the comparison result selector 322. Meanwhile, if the time-division-multiplexing signal has an even number of clock pulses, the comparison/addition result selector 323 outputs the result of addition of the envelope values input from the adder/subtractor 321.

In this manner, the comparator/adder unit 314a selectively operates as the comparator or the adder according to the time-division-multiplexing signal input from the time-division-multiplexing signal generator 311.

As explained above, in the transmission device 30 according to the third embodiment, a single unit of the rate decreasing/LPF unit 301 serves as both the function of decreasing the changing rate of the envelope signal of the transmission signal and the function of removing the high-frequency component included in the envelope signal with decreased changing rate. Therefore, an increase in circuit scale can be suppressed as compared with the configuration in which the rate decreasing unit and the LPF are separately provided, and thus the device can be reduced in size as much as possible.

According to one aspect of the transmission device disclosed in the present application, it is effective that the voltage-control distortion occurring in the amplifier can be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A transmission device comprising:
an amplifier that amplifies a transmission signal according to a voltage to be applied;
an envelope detector that detects an envelope signal of the transmission signal;
a rate decreasing unit that decreases a changing rate of the envelope signal;
a voltage controller that changes the voltage applied to the amplifier according to the envelope signal of which changing rate is decreased by the rate decreasing unit;
a voltage-control-distortion compensation-coefficient deciding unit that decides a distortion compensation coefficient for compensating for a voltage-control distortion, according to the envelope signal detected by the envelope detector and the envelope signal of which changing rate is decreased by the rate decreasing unit, the voltage-control distortion being a distortion occurring in the amplifier caused by a phase difference between the voltage applied to the amplifier by the voltage controller and the transmission signal input to the amplifier;
a distortion compensation-coefficient multiplier that multiplies the transmission signal by the distortion compensation coefficient;
a power calculator that calculates a power value of the transmission signal;
a nonlinear-distortion compensation-coefficient deciding unit that decides a distortion compensation coefficient for compensating for a nonlinear distortion, according to the power value of the transmission signal, the nonlinear distortion being a distortion occurring in the amplifier caused by nonlinear characteristic of the amplifier;
a distortion compensation-coefficient multiplier that multiplies the transmission signal by the distortion compensation coefficient decided by the nonlinear-distortion compensation-coefficient deciding unit; and
a distortion compensation-coefficient updating unit that updates the distortion compensation coefficient decided by the voltage-control-distortion compensation-coefficient deciding unit or the distortion compensation coefficient decided by the nonlinear-distortion compensation-coefficient deciding unit.

2. The transmission device according to claim 1, wherein the rate decreasing unit decreases the changing rate of the envelope signal, and removes a high-frequency component included in the envelope signal of which changing rate is decreased by the rate decreasing unit.

3. A distortion compensation device comprising:
an amplifier that amplifies a transmission signal according to a voltage to be applied;
an envelope detector that detects an envelope signal of the transmission signal;
a rate decreasing unit that decreases a changing rate of the envelope signal;
a voltage controller that changes the voltage applied to the amplifier according to the envelope signal of which changing rate is decreased by the rate decreasing unit;
a voltage-control-distortion compensation-coefficient deciding unit that decides a distortion compensation coefficient for compensating for a voltage-control distortion, according to the envelope signal detected by the envelope detector and the envelope signal of which changing rate is decreased by the rate decreasing unit, the voltage-control distortion being a distortion occurring in the amplifier caused by a phase difference between the voltage applied to the amplifier by the voltage controller and the transmission signal input to the amplifier;
a distortion compensation-coefficient multiplier that multiplies the transmission signal by the distortion compensation coefficient;
a power calculator that calculates a power value of the transmission signal;
a nonlinear-distortion compensation-coefficient deciding unit that decides a distortion compensation coefficient for compensating for a nonlinear distortion, according to the power value of the transmission signal calculated by the power calculator, the nonlinear distortion being a distortion occurring in the amplifier caused by nonlinear characteristic of the amplifier;
a distortion compensation-coefficient multiplier that multiplies the transmission signal by the distortion compensation coefficient decided by the nonlinear-distortion compensation-coefficient deciding unit; and
a distortion compensation-coefficient updating unit that updates the distortion compensation coefficient decided by the voltage-control-distortion compensation-coefficient deciding unit or the distortion compensation coefficient decided by the nonlinear-distortion compensation-coefficient deciding unit.

4. The distortion compensation device according to claim 3, wherein the rate decreasing unit decreases the changing rate of the envelope signal detected by the envelope detector, and removes a high-frequency component included in the envelope signal of which changing rate is decreased by the rate decreasing unit.

5. A distortion compensation method implemented by a transmission device provided with an amplifier that amplifies a transmission signal according to a voltage to be applied comprising:
detecting an envelope signal of the transmission signal;
decreasing a changing rate of the detected envelope signal;
changing the voltage applied to the amplifier according to the envelope signal of the decreased changing rate;
deciding a distortion compensation coefficient for compensating for a voltage-control distortion, according to the detected envelope signal and the envelope signal of the decreased changing rate, the voltage-control distortion being a distortion occurring in the amplifier caused by a phase difference between the voltage applied to the amplifier at the changing and the transmission signal input to the amplifier; and
multiplying the transmission signal by the decided distortion compensation coefficient.

6. The distortion compensation method according to claim 5, further comprising:
calculating a power value of the transmission signal;
deciding a distortion compensation coefficient for compensating for a nonlinear distortion, according to the calculated power value of the transmission signal, the nonlinear distortion being a distortion occurring in the amplifier caused by nonlinear characteristic of the amplifier;
multiplying the transmission signal by the decided distortion compensation coefficient; and
updating either the decided distortion compensation coefficient for the voltage-control distortion or the decided distortion compensation coefficient for the nonlinear distortion.

7. The distortion compensation method according to claim 5, wherein the decreasing includes decreasing the changing rate of the detected envelope signal, and removing a high-frequency component included in the envelope signal of the decreased changing rate.

* * * * *